(12) United States Patent
Kakuta

(10) Patent No.: US 8,018,666 B2
(45) Date of Patent: Sep. 13, 2011

(54) LENS-DRIVING UNIT

(75) Inventor: Yoshio Kakuta, Saitama (JP)

(73) Assignee: Tamron Co., Ltd., Saitama (JP)

( * ) Notice: Subject to any disclaimer, the term of this patent is extended or adjusted under 35 U.S.C. 154(b) by 147 days.

(21) Appl. No.: 12/521,477

(22) PCT Filed: Dec. 25, 2007

(86) PCT No.: PCT/JP2007/074868
§ 371 (c)(1),
(2), (4) Date: Sep. 1, 2009

(87) PCT Pub. No.: WO2008/081786
PCT Pub. Date: Jul. 10, 2008

(65) Prior Publication Data
US 2010/0321805 A1    Dec. 23, 2010

(30) Foreign Application Priority Data
Dec. 28, 2006    (JP) .................................. 2006-356053

(51) Int. Cl.
*G02B 7/02*    (2006.01)
(52) U.S. Cl. .......................... 359/824; 359/819; 359/811
(58) Field of Classification Search .......... 359/694–704, 359/811–824; 396/85, 44.24, 505, 44, 24
See application file for complete search history.

(56) References Cited

U.S. PATENT DOCUMENTS

| | | | | |
|---|---|---|---|---|
| 5,144,607 A | * | 9/1992 | Ishida et al. | 369/44.15 |
| 5,627,687 A | * | 5/1997 | Fujisawa | 359/823 |
| 7,215,488 B2 | * | 5/2007 | Nakashima et al. | 359/694 |
| 2006/0238893 A1 | | 10/2006 | Nakashima et al. | |

FOREIGN PATENT DOCUMENTS

| | | |
|---|---|---|
| JP | 2005057837 A | 3/2005 |
| JP | 2006098577 A | 4/2006 |
| JP | 2006301455 A | 11/2006 |

* cited by examiner

*Primary Examiner* — Mohammed Hasan
(74) *Attorney, Agent, or Firm* — The Webb Law Firm

(57) ABSTRACT

Provided is a lens-driving unit reduced in size and improved in durability. A first flexible printed wiring board of the lens-driving unit has a terminal on one side connected to a first piezoelectric motor and lead in parallel to an optical axis, and the other side connected to a unit for power supply and control, in a loop shape gently bent to an opposite direction to the leading direction. A second flexible printed wiring board of it has a terminal on one side connected to a piezoelectric motor and lead in parallel to the optical axis, and the other side connected to a unit for power supply and control, in a loop shape gently bent to the opposite direction to the leading direction. At such reference plane a structure symmetrically having the second and the first flexible printed wiring board with respect to a reference plane, is employed.

3 Claims, 6 Drawing Sheets

LENS-DRIVING UNIT

BACKGROUND OF THE INVENTION

1. Field of the Invention

The present invention relates to a lens-driving unit utilizing a flexible printed wiring board.

2. Description of Related Art

Conventionally, many imaging devices such as digital cameras adopt a type whereby a lens group moves in an optical axis direction. Based on such a type, the lens group is generally held by a lens group holding frame. The lens group holding frame is disposed so as to slide along the optical axis through a guide member provided for a casing.

Furthermore, such an imaging device is mounted with a lens-driving unit for driving the lens group holding frame. As the lens-driving unit, for example, lens-driving unit described in Japanese Patent Publication Nos. 2006-098577 and 2005-057837 are proposed. Such lens-driving units are provided with drive means and a flexible printed wiring board.

The drive means is drive the lens group holding frame using a drive force outputted from a driving device. On the other hand, the flexible printed wiring board is supply a control signal and drive power to the driving device. This flexible printed wiring board is made to bend in the optical axis direction so as to connect with the drive source to the power supply and control section. This allows, even if the lens group holding frame moves to slide in the optical axis direction, the flexible printed wiring board to follow the movement thereof.

However, in the lens-driving unit described in Japanese Patent Publication No. 2006-098577, a piezo-element as a drive source extends perpendicular to the optical axis. Therefore, in this lens-driving unit, the direction of the driving device is different from the bending direction of the flexible printed wiring board. Therefore, the size of the lens-driving unit must be set to be long in the optical axis direction and the direction perpendicular to the optical axis direction respectively. This may cause the size of the lens-driving unit to increase.

On the other hand, in the lens drive device described in Japanese Patent Publication No. 2005-057837, an oscillating wave linear motor as a drive source extends in the optical axis direction. For this reason, in this lens drive device, the direction of the drive device is the same as the bending direction of the flexible printed wiring board. Thus, this lens drive device can reduce the length in the direction orthogonal to the optical axis direction. Therefore, this lens-driving unit is able to make the lens-driving unit more compact.

SUMMARY OF THE INVENTION

However, in the lens drive device describe in Japanese Patent Publication No. 2005-057837, the flexible printed wiring board is extended parallel to the optical axis from the drive device, bent and folded back. As the result, it makes large stress in the bent part of the flexible printed wiring board. Thus, when this lens drive device is used for an extended period of time, wire breakage may be likely to occur in the flexible printed wiring board.

Therefore, this lens-driving unit can make more compact compared to the lens-driving unit according to Japanese Patent Publication. No. 2006-098577, but it has a problem with durability.

The present invention has been made in view of the above described conventional problems and has for its purpose to provide a lens-driving unit capable of making the apparatus more compact and improving durability.

Therefore, as a result of keen examination, the present inventors have achieved the following lens-driving unit to solve the above described problems.

The lens-driving unit utilizing a flexible printed wiring board to supply a control signal and drive power to a driving device of drive means when a lens-group holding frame constituting an imaging device is made slide along an optical axis, wherein the driving device is arranged in a vicinity of an outer periphery of a transition trail of the lens-group holding frame and constructed to slide in synchronization with the sliding movement of the lens-group holding frame, and the terminal arranged on one side of the flexible printed wiring board is connected to the driving device, and extended parallel to the optical axis, and turn back to form into a loop gently curved in a direction opposite to the extending direction, and the other side is directly or indirectly connected to the circuit of a power supply and a control.

In such a configuration of the present invention, the flexible printed wiring board is changing an extent of bent in the optical axis direction by the drive means moves. As the result, the moving direction of the drive means and the bending direction of the flexible printed wiring board to coincide with the optical axis direction. Thus, the lens-driving unit of the present invention can reduce the length in a direction orthogonal to the optical axis.

Furthermore, the flexible printed wiring board set with gently bent can be reduce a load on the bent portion of the flexible printed wiring board than the flexible print provided for the conventional lens driving unit. Therefore, even when used for a long period, the lens driving unit of the present invention is less likely to have wire breakage in the flexible printed wiring board.

Furthermore, in the lens-driving unit of the present invention, the lens-group holding frame is composed of a first lens-group holding frame and a second lens-group holding frame arranged in series along the optical axis, the flexible printed wiring board is composed of a first flexible printed wiring board that supplies a control signal and drive power to a driving device of first drive means when the first lens-group holding frame is made slide along the optical axis, and a second flexible printed wiring board that supplies a control signal and drive power to the driving device of second drive means when the second lens-group holding frame is made slide along the optical axis, the first driving device and the second driving device are arranged close to each other in a vicinity of outer peripheries of transition trail of the first lens-group holding frame and the second lens-group holding frame, and constructed to slide in synchronization with sliding movements of the first lens-group holding frame and the second lens-group holding frame, the first flexible printed wiring board of which terminal on one side thereof is connected to the first driving device, is extended parallel to the optical axis and turn back to form a loop gently curved in a direction opposite to the extending direction, and the other side is directly or indirectly connected to the power supply and the control section, the second flexible printed wiring board of which terminal on one side thereof is connected to the second drive source, is extended parallel to the optical axis and turn back to form a loop gently curved in a direction opposite to the extending direction and the other side is directly or indirectly connected to the power supply and the control section, and the first flexible printed wiring board and the second flexible printed wiring board are disposed to be mirror symmetry with each other against to a reference plane.

The lens-driving unit of the present invention can reduce the installation spaces for both flexible printed wiring boards compared to a lens-driving unit in which both flexible printed wiring boards are not arranged to be mirror symmetry.

Furthermore, the lens-driving unit of the present invention, the driving device is a piezoelectric motor.

The lens-driving unit of the present invention can reduce the installation space for the motor compared to a lens-driving unit in which the drive source is made up of an electromagnetic type motor.

Furthermore, in the lens-driving unit of the present invention, comprises the lens-driving unit comprises a lens-group holding frame moving distance measuring means for measuring a moving distance of the driving device and the moving distance is made to be a moving distance of the lens group holding frame, and the flexible printed wiring board is arranged so as not to obstruct measuring operation of the lens-group holding frame moving distance measuring mean.

Even when used for a long period, the lens-driving unit of the present invention is less likely to have wire breakage in the flexible printed wiring board, and can reliably measure the moving distance of the lens group holding frame.

The lens-driving unit according to the present invention reduces the length in the direction orthogonal to the optical axis by setting the moving direction of the drive means and the bending direction of the flexible printed wiring board to the optical axis direction. Therefore, the lens-driving unit of the present invention can reduce in size.

In the lens-driving unit of the present invention, the flexible printed wiring board is arranged with gently bent. As the result, reduce a load on the bent portion of the flexible printed wiring board compared to the flexible printed wiring board provided for the conventional lens-driving unit. Therefore, even when used for a long period, the lens drive unit of the present invention is less likely to have wire breakage in the flexible printed wiring board. Therefore, the lens-driving unit of the present invention can also increase of durability.

Furthermore, in the lens-driving unit of the present invention, when utilizing two flexible printed wiring boards, arranges both flexible printed wiring boards to be mirror symmetry with each other. This allows the lens-driving unit of the present invention to reduce the installation spaces for both flexible printed wiring boards compared to a lens-driving unit in which both flexible printed wiring boards are not arranged to be mirror symmetry with each other. Therefore, the lens-driving unit of the present invention can increase durability and realize further miniaturization even when two flexible printed wiring boards are used.

Furthermore, in the lens-driving unit of the present invention, the drive source is a piezoelectric motor. This allows the lens-driving unit of the present invention to reduce the installation space for the motor compared to a lens-driving unit in which to use an electromagnetic type motor as the driving device. Therefore, the lens-driving unit of the present invention can increase durability and realize further miniaturization.

Furthermore, the lens-driving unit of the present invention includes lens group holding frame moving distance measuring means, and arranges the flexible printed wiring board so as not obstruct the measuring operation of the lens group holding frame moving distance measuring means. As the result, the lens-driving unit of the present invention can reliably measure the moving distance of the lens group holding frame, and less likely to have wire breakage in the flexible printed wiring board even when used for a long period. Therefore, the lens-driving unit of the present invention can increase durability and enhance performance while realizing miniaturization.

DESCRIPTION OF THE PREFERRED EMBODIMENTS

Hereinafter, embodiments of the present invention will be demonstrated with reference to the accompanying drawings.

Figure 1:
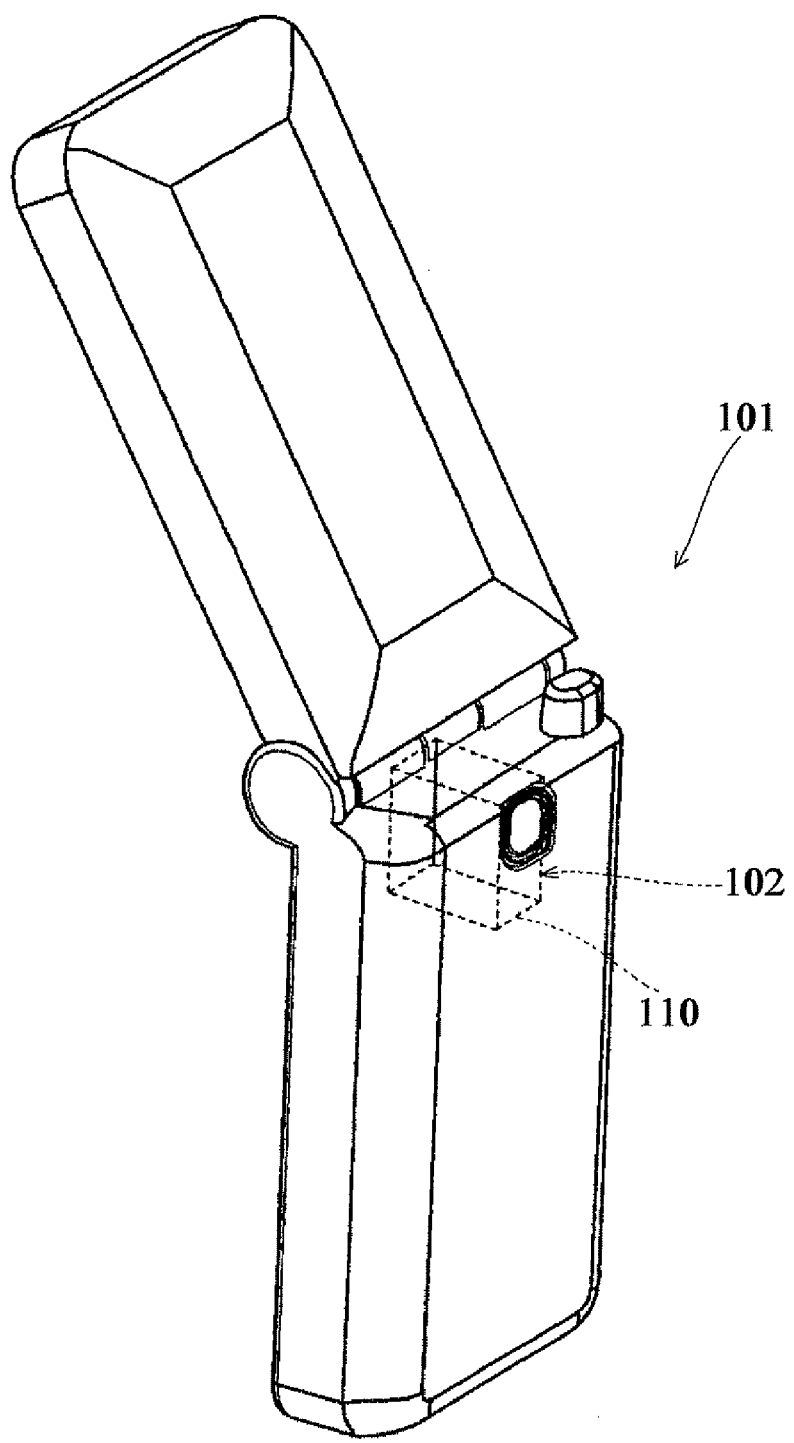
FIG. 1 is an outline view of a mobile phone showing an embodiment of the present invention.

FIG. 1 is the outline view of a mobile phone 101 showing the embodiment of the present invention. The mobile phone 101 is a mobile phone comprising a camera function and provided with the camera module 102. The camera module 102 is comprises the box-shaped case 110, a lens unit arranged in the case 110 and an image sensor (CCD). The camera module 102 is constructed to make the image sensor detect the light reflecting an image from an object according to an operator's instruction. And then the image information is converted to an electric signal and output the electric signal to an A/D converter or the like.

Figure 2:
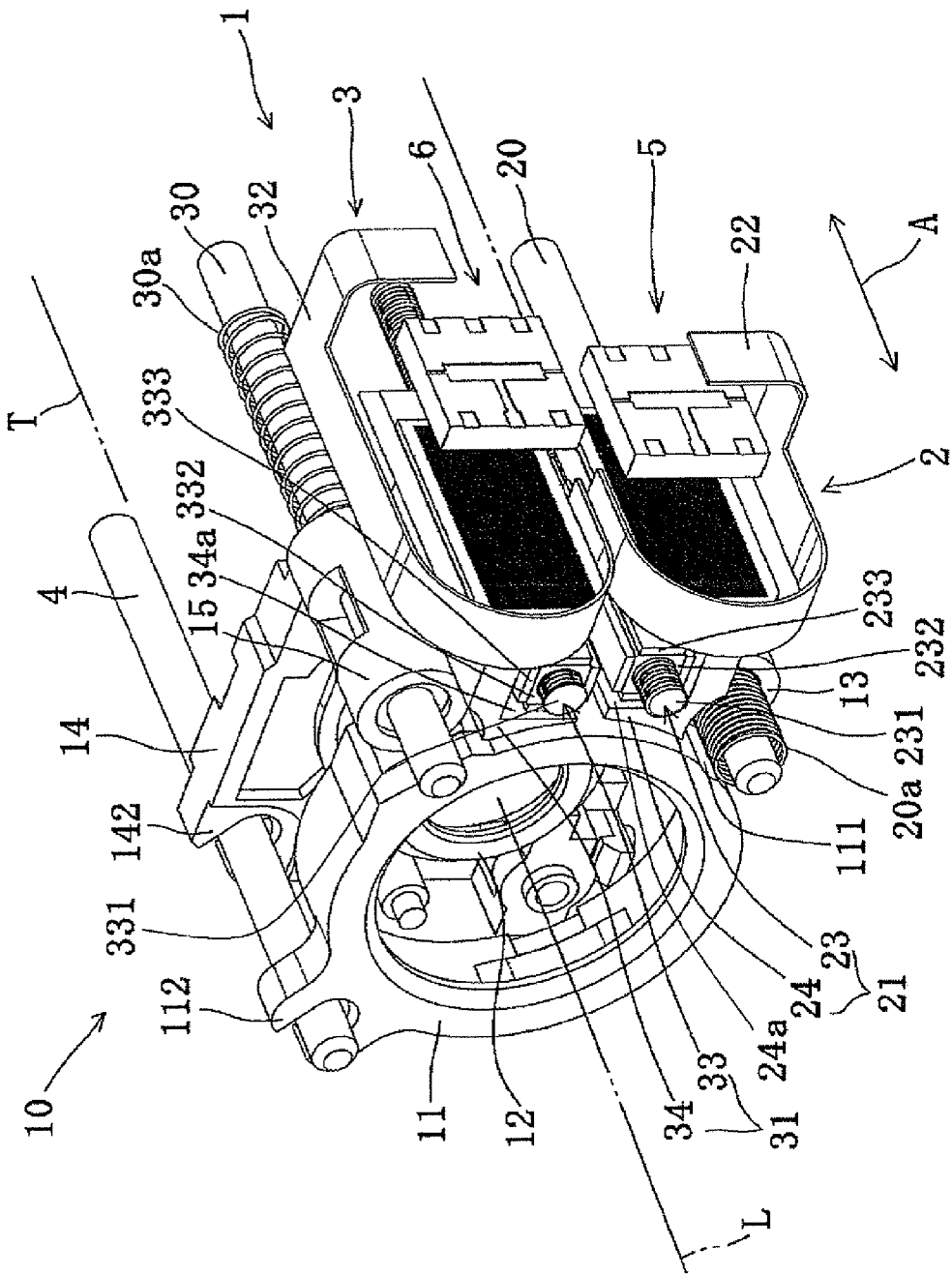
FIG. 2 is a perspective view of a lens unit showing the embodiment of the present invention.

FIG. 2 is a perspective view of a lens unit 10. The lens unit 10 comprises the first lens-group holding frame 11, the second lens-group holding frame 12 and the lens-driving unit 1.

The first lens-group holding frame 11 and the second lens-group holding frame 12 are arranged in series along the optical axis L. The first lens-group holding frame 11 is arranged in the front side (object side). The first lens-group holding frame 11 is constructed to hold a first lens group (not shown) therein.

In addition, a first guide part 13 is connected to the periphery region 111 out side of the first lens-group holding frame 11. The first guide part 13 is formed in a cylindrical shape and arranged parallel to the optical axis L. And the first lens-group holding frame 11 comprises the first rotation prevention pole container 112. The first rotation prevention pole container 112 is U-shaped when viewed from the object side (or focusing side).

On the other hand, the second lens-group holding frame 12 is arranged on a back side (focusing side). The second lens-group holding frame 12 is constructed to hold a second lens group (not shown) therein.

In addition, a support part 14 is connected to the back side (focusing side) of the second lens-group holding frame 12. The support part 14 is a part that supports the second lens-group holding frame 12 to arrange the second lens-group holding frame 12 in series to the first lens-group holding frame 11.

In addition, the second guide part 15 is connected to the support part 14. The second guide part 15 is formed in a cylindrical shape and disposed parallel to the optical axis L. The support part 14 also comprises the second rotation prevention pole container 142. The second rotation prevention pole container 142 is U-shaped when viewed from the object side (or focusing side).

The lens-driving unit 1 drives the first lens-group holding frame 11 and the second lens-group holding frame 12 independently. The lens-driving unit 1 is arranged on the right side of an outer region of a transition trail T of the lens-group holding frame. The transition trail T is a cylindrical trail where the first lens-group holding frame 11 and second lens-group holding frame 12 move along the optical axis L.

The lens-driving unit 1 comprises the first lens-group holding frame driving device 2, the second lens-group holding frame driving device 3, the rotation prevention pole 4, the first lens-group holding frame moving distance measuring device 5 and the second lens-group holding frame moving distance measuring device 6.

The rotation prevention pole 4 is a part to prevent rotation of the lens-group holding frames 11 and 12 when the lens-group holding frames 11 and 12 are made slide in an optical axis direction A. The rotation prevention pole 4 is furnished in the rotation prevention pole containers 112 and 142 of the lens-group holding frames 11 and 12.

Figure 3:
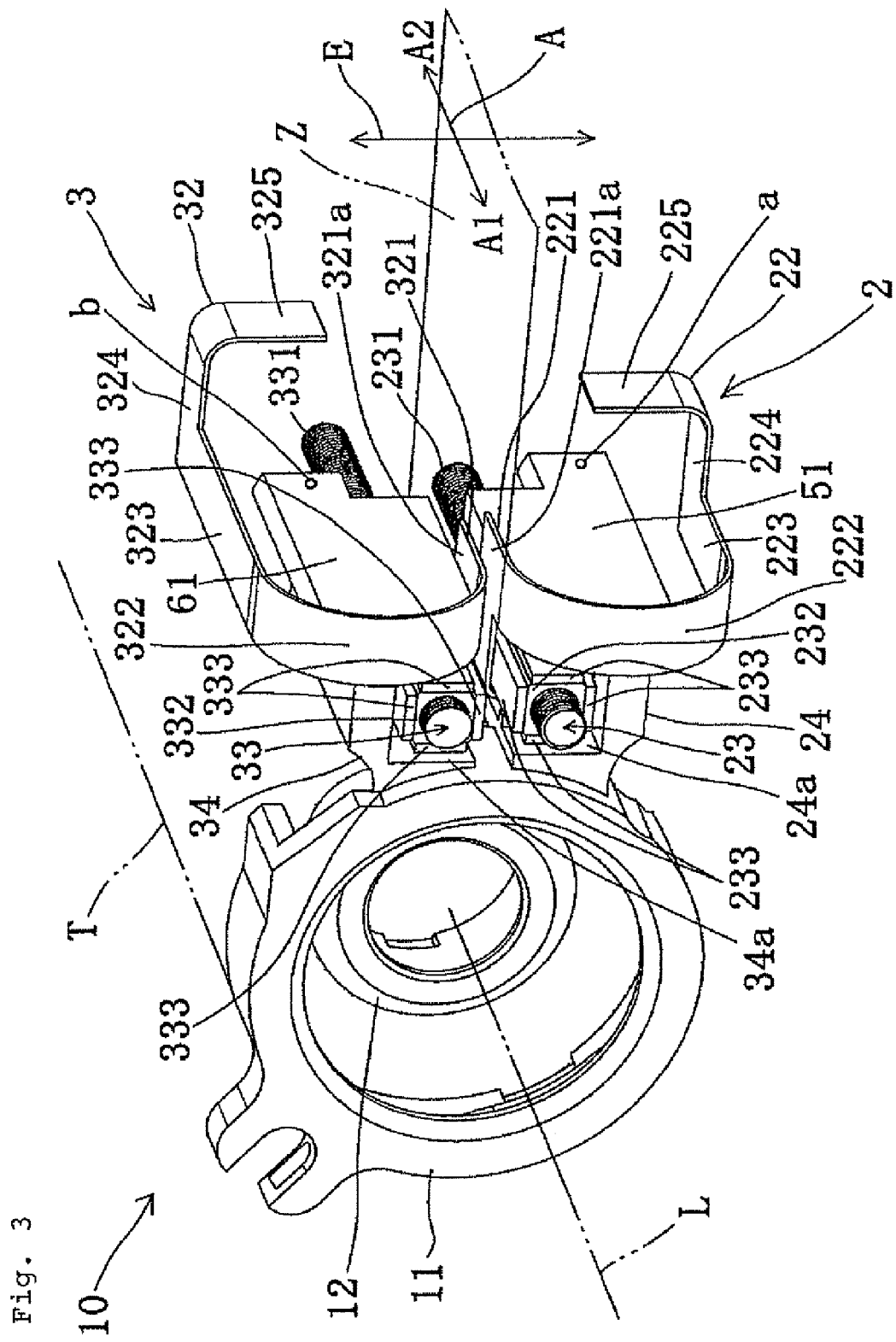
FIG. 3 is a perspective view of main as of the lens unit showing the embodiment of the present invention.

In addition, as shown in FIG. 3, the first lens-group holding frame driving device 2 and the second lens-group holding frame driving device 3 are arranged on the right side in the outer periphery region of the transition trail T, and closed and faced in a reference plane Z that passes through the optical axis L to each other.

The first lens-group holding frame driving device 2 is an apparatus that drives the first lens-group holding frame 11. The first lens-group holding frame driving device 2 comprises the first guide pole 20, the first drive means 21 and the first flexible printed wiring board 22 as shown in FIG. 2.

The first guide pole 20 is a part that supports the first lens-group holding frame 11 able to move in the optical axis direction A. The first guide pole 20 is formed in a long round bar shape. The first guide pole 20 is inserted into the first guide part 13 and arranged parallel to the optical axis L. The spring 20a is fitted on the first guide pole 20 closer to the object side than the first guide part 13. The spring 20a is arranged to push the first lens-group holding frame 11 always toward the focusing side.

On the other hand, the first drive means 21 comprises the first piezoelectric motor 23 and a first piezoelectric motor holding unit 24. The first piezoelectric motor 23 comprises one lead screw 231, one nut 232 and four piezo-elements 233.

The lead screw 231 is arranged parallel to the optical axis L. In addition, the nut 232 is geared with the lead screw 231. And the four piezo-elements 233 are arranged on the periphery of the nut 232.

In addition, the first piezoelectric motor holding unit 24 is the apparatus that makes the first lens-group holding frame 11 to move by using a drive force generated by the first piezoelectric motor 23. The first piezoelectric motor holding unit 24, as shown in FIG. 3, is arranged below the reference plane Z on the right side of the outer periphery region of the transition trail T. And then the first piezoelectric motor holding unit 24 is also connected to the first lens-group holding frame 11.

The first piezoelectric motor holding unit 24 is formed to be long in the optical axis direction A. In addition, the first piezoelectric motor holding unit 24 is formed to comprise concave surface when viewed from the object side (or focusing side). The first piezoelectric motor 23 is disposed and fixed in the first piezoelectric motor holding unit 24. Specifically, the nut 232 is fixed to the inner wall surface 24a of the first piezoelectric motor holding member 24 via each piezo-element 233 of the first piezoelectric motor 23.

In addition, the first encoder scale 51 is arranged on the right side of the first piezoelectric motor holding unit 24. The first encoder scale 51 is measure the moving distance of the first lens-group holding frame 11 (first lens group).

Figure 5:
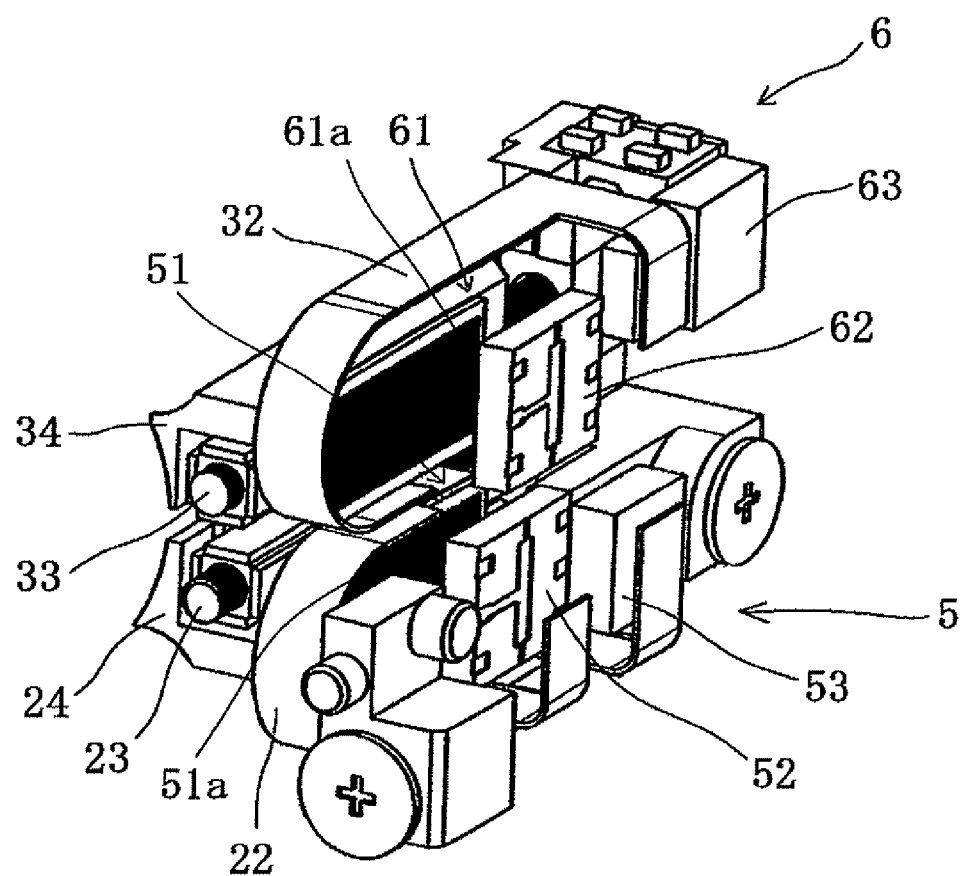
FIG. 5 is a perspective view showing a first lens group holding frame moving distance measuring device and a second lens group frame moving distance measuring device according to the embodiment of the present invention.

The first encoder scale 51 is arranged parallel to the transition trail T (optical axis L). As shown in FIG. 5, the plate comprising a scale face 51a is pasted to the right side of the first encoder scale 51. The scale face 51a extends back and forth so as to be parallel to the transition trail T. The length in the back and forth direction of the scale face 51a is set to be longer than the moving distance of the first lens-group holding frame 11 (first lens group). The scale face 51a can be reflecting irradiated light. Specifically, the scale face 51a has a black and white vertical stripe pattern (black and white reflection pattern). The pitch of the vertical stripe pattern is set according to the measuring accuracy of the moving distance of the first lens-group holding frame 11.

The first flexible printed wiring board 22 supplies drive power and a control signal to the first piezoelectric motor 23. The first flexible printed wiring board 22 is formed in a tape-like shape.

As shown in FIG. 3, the first flexible printed wiring board 22 is arranged on the right side of the first piezoelectric motor holding unit 24. Specifically, the first flexible printed wiring board 22 is arranged along the periphery of the outer first encoder scale 51.

Hereinafter, the embodiment of the first flexible printed wiring board 22 will be explained. As shown in FIG. 3, a terminal 221 on one side of the first flexible printed wiring board 22 is connected to the first piezoelectric motor 23, and extended parallel to the optical axis L. And the other side is connected to a unit for power supply and control (not shown), in a loop shape gently bent to an opposite direction A2 to a leading direction A1.

Figure 4:
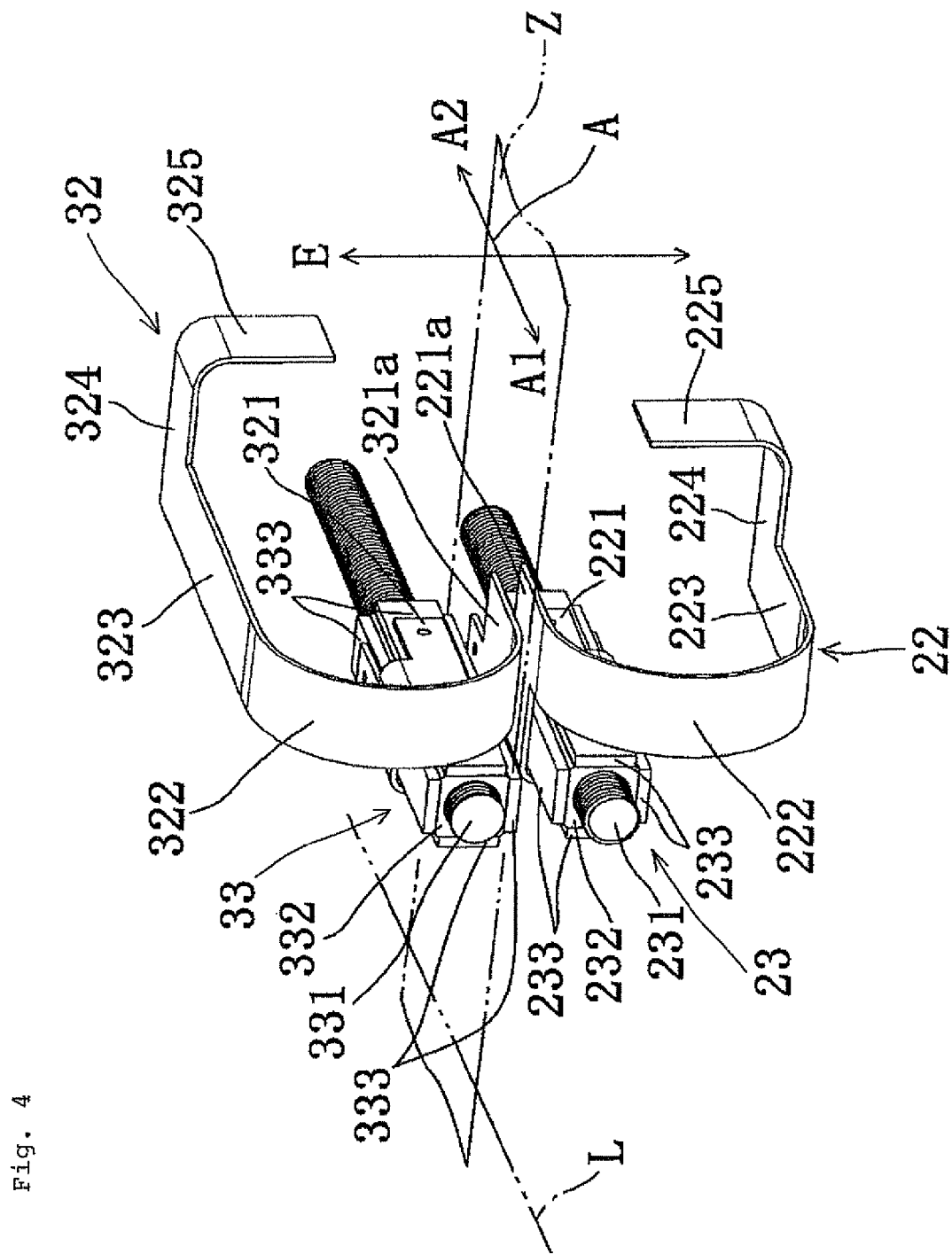
FIG. 4 is a perspective view showing a positional relationship between the first flexible printed wiring board and the second flexible printed wiring board according to the embodiment of the present invention.

This will be explained more specifically. As shown in FIG. 3 and FIG. 4, the first flexible printed wiring board 22 comprises the piezoelectric motor terminal 221, a bent section 222, a first extending section 223, a second extending section 224 and a power control section terminal 225.

One end side of the piezoelectric motor terminal 221 is wound around the first piezoelectric motor 23. Specifically, as shown in FIG. 3, the one end side of the piezoelectric motor terminal 221 is connected to a piezo-element 233 on the right side, a piezo-element 233 on the underside, a piezo-element 233 on the left side and a piezo-element 233 on the upper side in this order. The other end side 221a of the piezoelectric motor terminal 221 extends parallel to the reference plane Z to the right of the first encoder scale 51, as shown in FIG. 3.

In addition, the bent section 222 is flexible and extends in the vertical direction E (direction orthogonal to the optical axis L). The bent section 222 bent gently with parallel to the optical axis L and facing forward (object side). Specifically, the upper side of the bent section 222 reaches to the front end of the other end 221a of the piezoelectric motor terminal section 221. The bent section 222 is gently curved along the upper end, front end and lower end of the first encoder scale 51 in this order.

Furthermore, the first extending section 223 extends backward (focusing side) from the lower end of the bent section 222 and parallel to the reference plane Z. Specifically, the first extending section 223 extends to backward along the lower end of the first encoder scale 51.

Furthermore, the second extending section 224 extends rightward from the right end of the first extending section 223 in parallel to the reference plane Z. In addition, the power control section terminal 225 extends upward from the right end of the second extending section 224 and is connected to a unit for power supply and control (not shown). The power control section terminal 225 may be directly connected to the unit for power supply and control or may be indirectly connected to the unit for power supply and control section via a relay part.

Next, the method for driving the first lens-group holding frame 11 by the first lens-group holding frame driving device 2 will be demonstrated. First, drive power and a control signal are supplied from the unit for power supply and control to each piezo-element 233 via the first flexible printed wiring board 22. It results vibration in each piezo-element 233 and makes the lead screw 231 rotate to the direction clockwise or counterclockwise. The rotation of the lead screw 231 makes the nut 232 move along the lead screw 231. As the result, the first piezoelectric motor holding unit 24 is made move in the optical axis direction A and the first lens-group holding frame 11 is made slide along the first guide pole 20 in the optical axis direction A. And then, the bent section 222 of the first flexible printed wiring board 22 is deform in the optical axis direction A following the movement of the first piezoelectric motor holding unit 24.

On the other hand, as shown in FIG. 2, the first lens-group holding frame moving distance measuring device 5 is an apparatus that measures the moving distance of the first piezoelectric motor 23 (nut 232) and regards the moving distance as a moving distance of the first lens-group holding frame 11 (moving distance of the first lens group). That is, the first lens-group holding frame moving distance measuring device 5 is lens-group holding frame moving distance measuring means of the present invention. As shown in FIG. 5, the first lens-group holding frame moving distance measuring device 5 comprises the first encoder scale 51 which is aforementioned, a first optical sensor 52, a first interrupter 53 and the control section (not shown).

Figure 6:
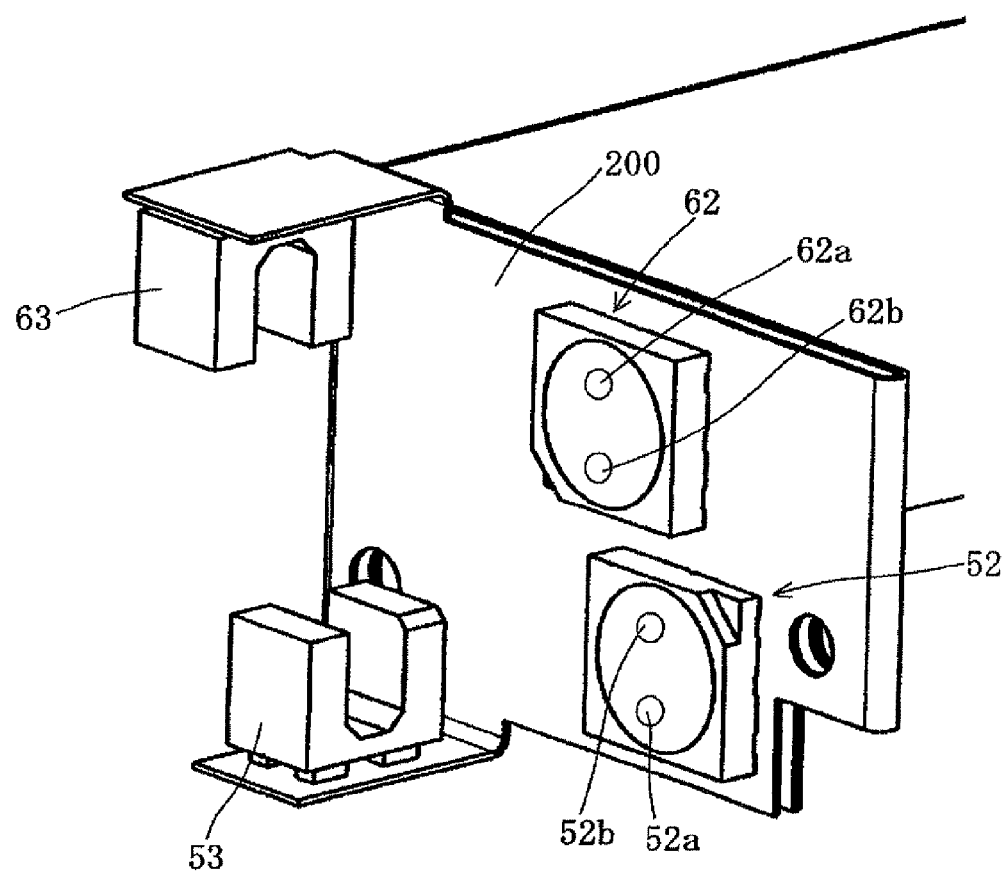
FIG. 6 is a perspective view showing the optical sensors and the interrupters of the first lens group holding frame moving distance measuring device and the second lens group holding frame moving distance measuring device according to the embodiment of the present invention.

The first optical sensor 52 detects a difference of light reflected from the first encoder scale 51 by irradiating light, converts to a signal (detected signal) and sends the signal to outside. The first optical sensor 52 is arranged on the right side of the first flexible printed wiring board 22. Specifically, the first optical sensor 52 is set on a flexible substrate 200 which is arranged on the right side of the first flexible printed wiring board 22, and faced to the first encoder scale 51 as shown in FIG. 6. The first optical sensor 52 comprises a light emitting section 52a and a light receiving section 52b. The light emitting section 52a is constructed to irradiate light onto the scale face 51a of the first encoder scale 51. Furthermore, the light receiving section 52b is constructed to receive reflected light from the scale face 51a.

In addition, the first interrupter 53 is intended to determine a reference position when measuring a moving distance of the first lens-group holding frame 11. The first interrupter 53 is arranged on the rearward side of the first flexible printed wiring board 22 as shown in FIG. 5. The first interrupter 53 is constructed so that a switch is turned off at a position shown by "a" on the rearward side of the first encoder scale 51 as shown in FIG. 3.

The control section is connected to the first optical sensor 52. The control section is constructed to compute the moving distance of the first lens-group holding frame 11 based on the detected signal sent from the first optical sensor 52.

Next, the method for measuring the first lens-group holding frame 11 by the first lens group holding frame moving distance measuring device 5 will be demonstrated. First, when the first lens-group holding frame 11 is positioned at the end of the image-forming side, the position shown by "a" of the first encoder scale 51 in FIG. 3 at which the switch of the first interrupter 53 turns OFF is made a reference position. The first optical sensor 52 irradiates light from the light emitting section 52a onto a predetermined position of the scale face 51a of the first encoder scale 51.

Simultaneously with the sliding movement of the first lens-group holding frame 11, the first encoder scale 51 slide. Accordingly, the vertical stripe pattern of the scale face 51a traverses the light irradiated onto the predetermined position of the scale face 51. At that time, the first optical sensor 52 receives reflected light at the light receiving section 52b. The first optical sensor 52 converts a difference of reflected light received at the light receiving section 52b to a detected signal and sends the detected signal to the control section. The control section calculates the moving distance of the first lens-group holding frame 11 from the detected signal sent from the first optical sensor 52 and thereby obtains the moving distance of the first lens group.

On the other hand, as shown in FIG. 2, the second lens-group holding frame driving device 3 is an apparatus that drives the second lens-group holding frame 12. The second lens-group holding frame driving device 3 comprises the second guide pole 30, the second drive means 31 and the second flexible printed wiring board 32.

The second guide pole 30 is a part that supports the second lens-group holding frame 12 able to move in the optical axis direction A. The second guide pole 30 is formed in a long round bar shape. The second guide pole 30 is inserted into the second guide part 15 and arranged parallel to the optical axis L. The spring 30a is fitted on the second guide pole 30 closer to the image-forming side than the second guide part 15. The spring 30a is arranged to push the second lens-group holding frame 12 always toward the object side.

On the other hand, the second drive means 31 comprises the second piezoelectric motor 33 and a second piezoelectric motor holding unit 34. The second piezoelectric motor 33 comprises one lead screw 331, one nut 332 and four piezo-elements 333.

The lead screw 331 is arranged parallel to the optical axis L. In addition, the nut 332 is geared with the lead screw 331. And the four piezo-elements 333 are arranged on the periphery of the nut 332.

In addition, the second piezoelectric motor holding unit 34 is the apparatus that makes the second lens-group holding frame 12 to move by using a drive force generated by the second piezoelectric motor 33. The second piezoelectric motor holding unit 34, as shown in FIG. 3, is arranged above the reference plane Z on the right side of the outer periphery region of the transition trail T. In addition, the second piezoelectric motor holding member 34 is arranged close to and opposed to the first piezoelectric motor holding member 24 across the reference plane Z. And then the second piezoelectric motor holding unit 34 is also connected to the second lens-group holding frame 12.

And the second piezoelectric motor holding unit 34 is formed to be long in the optical axis direction A. In addition, the second piezoelectric motor holding unit 34 comprises concave surface when viewed from the object side (or focusing side). The second piezoelectric motor 33 is disposed in the second piezoelectric motor holding unit 34. Specifically, the nut 332 is fixed to the inner wall surface 34a of the second piezoelectric motor holding unit 34 via each piezo-element 333 of the second piezoelectric motor 33.

In addition, the second encoder scale 61 is arranged on the right side of the second piezoelectric motor holding unit 34.

The second encoder scale 61 is measure the moving distance of the second lens-group holding frame 12 (second lens group).

The second encoder scale 61 is arranged parallel to the transition trail T (optical axis L). As shown in FIG. 5, a plate comprises a scale face 61a is pasted to the right side of the second encoder scale 61. The scale face 61a extends back and forth so as to be parallel to the transition trail T. The length in the back and forth direction of the scale face 61a is set to be longer than the moving distance of the second lens-group holding frame 12 (second lens group). The scale face 61a is can be reflecting irradiated light. Specifically, the scale face 61a has a black and white vertical stripe pattern (black and white reflection pattern). The pitch of the vertical stripe pattern is set according to the measuring accuracy of the moving distance of the second lens-group holding frame 12.

The second flexible printed wiring board 32 supplies drive power and a control signal to the second piezoelectric motor 33. The second flexible printed wiring board 32 is formed in a tape-like shape.

As shown in FIG. 3, the second flexible printed wiring board 32 is arranged on the right side of the second piezoelectric motor holding unit 34. Specifically, the second flexible printed wiring board 32 is arranged along the periphery of the outer second encoder scale 61.

Hereinafter, the embodiment of the second flexible printed wiring board 32 will be explained. As shown in FIG. 3, a terminal 321 on one side of the second flexible printed wiring board 32 is connected to the second piezoelectric motor 33, and extended parallel to the optical axis L. And the other side is connected to a unit for power supply and control (not shown), in a loop shape gently bent to an opposite direction A2 to a leading direction A1.

Furthermore, the second flexible printed wiring board 32 and the first flexible printed wiring board 22 are arranged symmetrically with each other with respect to the reference plane Z at the reference position shown in FIG. 3. This will be explained more specifically. As shown in FIG. 3 and FIG. 4, the second flexible printed wiring board 32 comprises the piezoelectric motor terminal section 321, the curved section 322, the first extending section 323, the second extending section 324 and the power control section terminal 325.

One side of the piezoelectric motor terminal 321 is wound around the second piezoelectric motor 33. Specifically, the one side of the piezoelectric motor terminal 321 is connected to a piezo-element 333 on the right side, a piezo-element 333 on the upper side, a piezo-element 333 on the left side and a piezo-element 333 on the under side in this order. As shown in FIG. 3, the other end side 321a of the piezoelectric motor terminal section 321 extends parallel to the reference plane Z to the right of the second encoder scale 61.

In addition, the bent section 322 is flexible and extends in the vertical direction E. The bent section 322 bent gently with parallel to the optical axis L and facing forward (object side). And the bent section 322 is arranged symmetrically with respect to the reference plane Z to the bent section 222 of the first flexible printed wiring board 22. Specifically, the lower side of the bent section 322 reaches to the front end of the other end 321a of the piezoelectric motor terminal section 321. The bent section 322 is gently curved along the lower end, front end and upper end of the second encoder scale 61 in this order.

Furthermore, the first extending section 323 and the first extending section 223 of the first flexible printed wiring board 22 are arranged symmetrically with each other with respect to the reference plane Z. That is, the first extending section 323 extends backward (focusing side) from the upper end of the curved section 322 parallel to the reference plane Z. In other words, the first extending section 323 extends backward along the upper end of the second encoder scale 61.

The second extending section 224 of the first flexible printed wiring board 22 and the second extending section 324 are arranged vertically symmetrically with each other with respect to the reference plane Z. That is, the second extending section 324 extends rightward from the right end of the first extending section 223 parallel to the reference plane Z.

Furthermore, the power control section terminal 325 and the power control section terminal 225 of the first flexible printed wiring board 22 are arranged symmetrically with each other with respect to the reference plane Z. That is, the power control section terminal 325 extends downward from the right end of the second extending section 324. The power control section terminal 325 is connected to the power supply and control section (not shown). The power control section terminal 325 may be directly connected to the power supply and control section or indirectly connected to the power supply and control section via a relay member.

Next, the method for driving the second lens-group holding frame 12 by the second lens-group holding frame driving device 3 will be demonstrated. First, drive power and a control signal are supplied from the unit for power supply and control to each piezo-element 333 via the second flexible printed wiring board 32. It results vibration in each piezo-element 333 and makes the lead screw 331 to rotate to the direction clockwise or counterclockwise. The rotation of the lead screw 331 makes the nut 332 move along the lead screw 331. As the result, the second piezoelectric motor holding unit 34 made move in the optical axis direction A. And then, the bent section 322 of the second flexible printed wiring board 32 is deform in the optical axis direction A following the movement of the second piezoelectric motor holding unit 34.

On the other hand, as shown in FIG. 2, the second lens-group holding frame moving distance measuring device 6 is an apparatus that measures the moving distance of the second piezoelectric motor 33 (nut 332) and regards the moving distance as a moving distance of the second lens-group holding frame 12 (moving distance of the second lens group). That is, the second lens-group holding frame moving distance measuring device 6 is lens-group holding frame moving distance measuring means of the present invention. As shown in FIG. 5, the second lens-group holding frame moving distance measuring device 6 comprises the second encoder scale 61 which is aforementioned, a second optical sensor 62, a second interrupter 63 and the control section (not shown).

The second optical sensor 62 detects a difference of light reflected from the second encoder scale 61 by irradiating light, converts to a signal (detected signal) and sends the signal to outside. The second optical sensor 62 is arranged on the right side of the second flexible printed wiring board 32. Specifically, the second optical sensor 62 is set on the flexible substrate 200 arranged on the right side of the second flexible printed wiring board 32, and faced to the second encoder scale 61 as shown in FIG. 6. The second optical sensor 62 comprises a light emitting section 62a and a light receiving section 62b. The light emitting section 62a is constructed to irradiate light onto the scale face 61a of the second encoder scale 61. Furthermore, the light receiving section 62b is constructed to receive reflected light from the scale face 61a.

In addition, the second interrupter 63 is intended to determine a reference position when moving a distance of the second lens-group holding frame 12. The second interrupter 63 is arranged on the rearward side of the second flexible printed wiring board 32 as shown in FIG. 5. The second interrupter 53 is constructed so that a switch is turned OFF at a position shown by "b" on the rearward side of the second encoder scale 61 as shown in FIG. 3.

The control section is connected to the second optical sensor 62. The control section is constructed to compute the moving distance of the second lens-group holding frame 12 based on the detected signal sent from the second optical sensor 62.

Next, the method for measuring the first lens-group holding frame 12 by the second lens-group holding frame moving distance measuring device 6 will be demonstrated. First, the second lens-group holding frame 12 is positioned the focusing side, and the position shown by "b" of the second encoder scale 61 in FIG. 3 at which the switch of the second interrupter 63 turns OFF is regarded as a reference position. The second optical sensor 62 irradiates light from the light emitting section 62a onto a predetermined position of the scale face 61a of the second encoder scale 61.

Simultaneously with the sliding movement of the second lens-group holding frame 12, the second encoder scale 61 slide. Accordingly, the vertical stripe pattern of the scale face 61a traverses the light irradiated onto the predetermined position of the scale face 61. At that time, the second optical sensor 62 receives reflected light at the light receiving section 62b. The second optical sensor 62 converts a difference of reflected light received at the light receiving section 62b to a detected signal and sends the detected signal to the control section. The control section calculates the moving distance of the second lens-group holding frame 12 from the detected signal sent from the second optical sensor 62 and thereby obtains the moving distance of the second lens group.

In the lens-driving unit 1 of the present embodiment in such a configuration, the flexible printed wiring boards 22 and 32 are bent in the optical axis direction A as the drive means 21 and 31 move. Thus, the moving direction of the drive means 21 and 31 and the bending direction of the flexible printed wiring boards 22 and 33 coincide with the optical axis direction A. Therefore, the lens-driving unit 1 of the present embodiment reduces the length in the direction E orthogonal to the optical axis L. Therefore, the lens-driving unit 1 of the present embodiment can make the apparatus more compact.

Furthermore, in the lens-driving unit 1 of the present embodiment, both flexible printed wiring boards 22 and 32 are arranged with gently curved. To reduce a load on the bent parts (bent sections 222 and 322) of both flexible printed wiring boards 22 and 32 compared to the flexible printed wiring board provided for the conventional lens-driving unit. Therefore, even when used for a long period, the lens-driving unit 1 of the present embodiment is less likely to have wire breakage in the flexible printed wiring boards 22 and 32. Therefore, the lens-driving unit 1 of the present embodiment can also increase of durability.

Furthermore, in the lens-driving unit 1 of the present embodiment, both lens-group holding frame driving devices 2 and 3 are arranged opposed to each other. Thus, the lens-driving unit 1 of the present invention can reduce the size thereof compared to the lens-driving unit in which both lens-group holding frame driving devices 2 and 3 are not opposed to each other. Therefore, the lens-driving unit 1 of the present embodiment can increase durability and realize further miniaturization.

Furthermore, in the lens-driving unit 1 of the present embodiment, both lens group holding frame driving devices 2 and 3 are arranged close to each other. This further reduces the overall size of the lens-driving unit 1 of the present invention. Therefore, the lens-driving unit 1 of the present embodiment can increase durability and realize further miniaturization.

Furthermore, in the lens-driving unit 1 of the present embodiment, both drive means 21 and 31 are arranged opposed to each other. Thus, the lens-driving unit 1 of the present embodiment can reduce the installation space for the drive means compared to the lens-driving unit in which both drive means 21 and 31 are not opposed to each other. Therefore, the lens-driving unit 1 of the present embodiment can increase durability and realize further miniaturization.

Furthermore, in the lens-driving unit 1 of the present embodiment, both drive means 21 and 31 are arranged so as to be opposed to each other in the direction E orthogonal to the optical axis L. Thus, the lens-driving unit 1 of the present embodiment can reduce the length in the optical axis direction A compared to the lens-driving unit in which both drive means 21 and 31 are opposed to each other in the optical axis direction A. Therefore, the lens-driving unit 1 of the present embodiment can increase durability and realize further miniaturization.

Furthermore, in the lens-driving unit 1 of the present embodiment, both flexible printed wiring boards 22 and 32 are arranged to be mirror symmetry (symmetry with respect to the reference plane Z) with each other at the reference position shown in FIG. 3. Thus, the lens-driving unit 1 of the present embodiment can reduce the installation spaces for both flexible printed wiring boards 22 and 32 compared to the lens-driving unit in which both flexible printed wiring boards 22 and 32 are not arranged to be mirror symmetry with each other. Therefore, the lens-driving unit 1 of the present embodiment can increase durability and realize further miniaturization even when two flexible printed wiring boards are used.

In addition, in the lens-driving unit 1 of the present embodiment, both flexible printed wiring boards 22 and 32 are arranged so as to be mirror symmetric in the direction E orthogonal to the optical axis L. Thus, the lens-driving unit 1 of the present embodiment can reduce the length in the optical axis direction A compared to the lens-driving unit in which both flexible printed wiring boards 22 and 32 are arranged so as to be mirror symmetric with each other in the optical axis direction A. Therefore, the lens-driving unit 1 of the present embodiment can increase durability and realize further miniaturization even when two flexible printed wiring boards are used.

Furthermore, in the lens-driving unit 1 of the present embodiment, the flexible printed wiring boards 22 and 32 are arranged along the periphery of the outer encoder scales 51 and 61. This allows the lens-group holding frame moving distance measuring devices 5 and 6 to prevent measuring operation of the moving distances of the lens-group holding frames 11 and 12 from being obstructed. Therefore, even when used for a long period of time, the lens-driving unit 1 of the present embodiment is less likely to have wire breakage in both flexible printed wiring boards 22 and 32 and allows the moving distances of both lens group holding frames 11 and 12 to be measured reliably. Therefore, the lens-driving unit 1 of the present embodiment can increase durability and enhance performance while realizing miniaturization.

The lens-driving unit 1 of the present embodiment is arranged on the right side of the outer periphery region of the transition trail T as shown in FIG. 2. However, the location of the lens-driving unit 1 need not be limited to this position but may be arranged on one end side of the periphery region of the outer transition trail T. Furthermore, the present embodiment is applied to both lens-group holding frame driving devices 2 and 3 in the present embodiment. However, the present embodiment may be applied to a lens drive apparatus that drives at least one lens-group holding frame. For example, the present embodiment may be applied to any one of the first lens-group holding frame driving device 2 and the second lens-group holding frame driving device 3 demonstrated in the embodiment.

Furthermore, in the lens-driving unit 1 of the present embodiment, the drive sources of both drive means 21 and 31 are made up of the piezoelectric motors 23 and 33. Therefore, the lens-driving unit 1 of the present embodiment can reduce the installation space for the motor compared to the lens driving device in which the drive source is made up of an electromagnetic type motor. Therefore, the lens-driving unit 1 of the present embodiment can increase durability and realize further miniaturization.

Furthermore, the lens-driving unit 1 of the present embodiment can make the camera module 102 (see FIG. 1) more compact and increase durability. In addition, being provided with the camera module 102, the mobile phone 101 of the present embodiment can reduce the size (reduce the thickness) and increase durability compared to a mobile phone provided with the conventional camera module (lens driving device).

The present embodiment demonstrate the lens-driving unit of the present embodiment installed in a mobile phone, but the lens-driving unit of the present embodiment may also be applied to other imaging devices such as digital camera. It means that the lens-driving unit of the present invention is particularly suitable for use in an imaging device used for an extended period of time or an imaging device having a limited installation space for the lens-driving unit.

As explained above, the lens-driving unit of the present invention can reduced in size and improved in durability. Therefore, the present invention can sufficiently be used for the technical field of lens driving devices.

The invention claimed is:

1. A lens-driving unit utilizing a flexible printed wiring board to supply a control signal and drive power to a driving device of drive means when a lens-group holding frame constituting an imaging device is made slide along an optical axis, wherein the driving device is arranged in a vicinity of an outer periphery of a transition trail of the lens-group holding frame and constructed to slide in synchronization with the sliding movement of the lens-group holding frame, and the terminal arranged on one side of the flexible printed wiring board is connected to the driving device, and extended parallel to the optical axis, and turn back to form into a loop gently curved in a direction opposite to the extending direction, and the other side is directly or indirectly connected to the circuit of a power supply and a control; and wherein the lens-group holding frame is composed of a first lens-group holding frame and a second lens-group holding frame arranged in series along the optical axis, the flexible printed wiring board is composed of a first flexible printed wiring board that supplies a control signal and drive power to a driving device of first drive means when the first lens-group holding frame is made slide along the optical axis, and a second flexible printed wiring board that supplies a control signal and drive power to the driving device of second drive means when the second lens-group holding frame is made slide along the optical axis, the first driving device and the second driving device are arranged close to each other in a vicinity of outer peripheries of transition trail of the first lens-group holding frame and the second lens-group holding frame, and constructed to slide in synchronization with sliding movements of the first lens-group holding frame and the second lens-group holding frame, the first flexible printed wiring board of which terminal on one side thereof is connected to the first driving device, is extended parallel to the optical axis and turn back to form a loop gently curved in a direction opposite to the extending direction, and the other side is directly or indirectly connected to the power supply and the control section, the second flexible printed wiring board of which terminal on one side thereof is connected to the second drive source, is extended parallel to the optical axis and turn back to form a loop gently curved in a direction opposite to the extending direction and the other side is directly or indirectly connected to the power supply and the control section, and the first flexible printed wiring board and the second flexible printed wiring board are disposed to be mirror symmetry with each other against to a reference plane.

2. The lens-driving unit according to claim 1, wherein the driving device is a piezoelectric motor.

3. The lens-driving unit according to claim 1, wherein the lens-driving unit comprises a lens-group holding frame moving distance measuring means for measuring a moving distance of the driving device and the moving distance is made to be a moving distance of the lens group holding frame, and the flexible printed wiring board is arranged so as not to obstruct measuring operation of the lens-group holding frame moving distance measuring means.

\* \* \* \* \*